United States Patent
Tohnoe et al.

(10) Patent No.: US 8,975,191 B2
(45) Date of Patent: Mar. 10, 2015

(54) PLASMA ETCHING METHOD

(75) Inventors: Kazuhito Tohnoe, Miyagi (JP); Yusuke Hirayama, Miyagi (JP); Yasuyoshi Ishiyama, Miyagi (JP); Wataru Hashizume, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/983,826

(22) PCT Filed: Feb. 7, 2012

(86) PCT No.: PCT/JP2012/052789
§ 371 (c)(1),
(2), (4) Date: Oct. 9, 2013

(87) PCT Pub. No.: WO2012/108445
PCT Pub. Date: Aug. 16, 2012

(65) Prior Publication Data
US 2014/0045338 A1 Feb. 13, 2014

(30) Foreign Application Priority Data
Feb. 8, 2011 (JP) ................................ 2011-025083

(51) Int. Cl.
*H01L 21/3065* (2006.01)
*H01L 21/768* (2006.01)
*H01L 21/308* (2006.01)

(52) U.S. Cl.
CPC ...... *H01L 21/3065* (2013.01); *H01L 21/76898* (2013.01); *H01L 21/3086* (2013.01); *H01J 2237/334* (2013.01)

USPC .......... 438/719; 438/706; 438/710; 438/712; 438/720; 156/345.48

(58) Field of Classification Search
USPC ........................ 438/706, 710, 712, 719, 720; 156/345.48
See application file for complete search history.

(56) References Cited

U.S. PATENT DOCUMENTS

| 6,284,606 | B1* | 9/2001 | Samudra et al. ............... 438/270 |
| 6,812,151 | B1* | 11/2004 | Nanbu et al. ................... 438/706 |
| 2010/0326954 | A1* | 12/2010 | Zhuo et al. ....................... 216/24 |
| 2011/0130007 | A1* | 6/2011 | Ching et al. .................. 438/710 |

FOREIGN PATENT DOCUMENTS

JP 2009-206410 9/2009

* cited by examiner

*Primary Examiner* — Duy Deo
*Assistant Examiner* — Maki Angadi
(74) *Attorney, Agent, or Firm* — IPUSA, PLLC

(57) ABSTRACT

There is provided a plasma etching method including a first process of etching an intermediate layer, which contains silicon and nitrogen and is positioned below a resist mask formed on a surface of a substrate, to cause a silicon layer positioned below the intermediate layer to be exposed through the resist mask and the intermediate layer, a second process of subsequently supplying a chlorine gas to the substrate to cause a reaction product to attach onto sidewalls of opening portions of the resist mask and the intermediate layer, and a third process of etching a portion of the silicon layer corresponding to the opening portion of the intermediate layer using a process gas containing sulfur and fluorine to form a recess in the silicon layer.

4 Claims, 14 Drawing Sheets

PLASMA ETCHING METHOD

TECHNICAL FIELD

The present invention relates to a plasma etching method of forming a recess by supplying plasma of a process gas to a substrate formed by laminating a resist mask, an intermediate layer containing silicon and nitrogen, and a silicon layer from an upper side and etching the silicon layer to form a recess.

BACKGROUND ART

Along with a preference for a three-dimensional structure in a device structure, structures have been studied by sterically stacking substrates (hereinafter, referred to as "wafer") such as a semiconductor wafer, on which an integrated circuit is mounted, on one another and by electrically connecting the mutually adjacent wafers by wiring metals embedded in the wafers. In this case, a recess such as a hole for embedding the wiring metal in the wafer is formed in each wafer by a plasma etching process. Specifically, the wafer includes a monocrystalline silicon (Si) layer, in which the recess is formed, for example, and a resist mask, which is laminated above the silicon layer and patterned to correspond to the pattern of the recess. Between the silicon layer and the resist mask, an intermediate layer containing, for example, a silicon nitride (SiN) film is interposed to use it as a stopper film in, for example, a chemical mechanical polishing (CMP) process of removing excess metal after embedding the wiring metal in the recess. Therefore, after the silicon layer is exposed on the intermediate layer by etching the intermediate layer, the silicon layer undergoes an etching process.

The depth of the recess may be 100 μm relative to an opening size of, for example, about 10 μm. Therefore, a sidewall of the silicon nitride film is exposed to plasma while the silicon layer is etched by the plasma of the process gas containing, for example, a sulfur fluoride ($SF_6$) gas, an oxygen ($O_2$) gas, and so on. Therefore, the silicon nitride film is side-etched from a side of the silicon nitride film (a side of the recess). Then, an airspace is formed between the resist mask and the silicon film around the recess. When the airspace is formed, the wiring metal intrudes into the airspace in a subsequent process. Then, desired device characteristic features are not obtainable such that a leak current increases.

Patent document 1 discloses a technique of restricting undercut from occurring by forming a protection film on a sidewall of a photo resist film using, for example, plasma of a $C_4F_8$ gas.

RELATED ART DOCUMENT

Patent Document

[Patent Document 1] Japanese Laid-open Patent Publication No. 2009-206410 (Paragraph No. 0047 etc.)

DISCLOSURE OF THE INVENTION

Problems to be Solved by the Invention

However, if this CF gas is used, an efficiency of forming a deposit (a protection film) becomes insufficient, resulting in a lower throughput. Further, a process subsequently performed in a treatment chamber is adversely influenced by attached matter attached onto an inner wall surface of the treatment chamber.

The present invention is provided under this situation. The object of the present invention is to provide a plasma etching method, by which side-etching of an intermediate layer can be restricted from occurring in forming a recess in a silicon layer by performing a plasma etching process for substrates formed by laminating a resist mask, the intermediate layer containing silicon and nitrogen, and the silicon layer in this order from an upper side using a pattern of the resist mask.

Means for Solving Problems

A plasma etching method including a first process of etching an intermediate layer, which contains silicon and nitrogen and is positioned below a resist mask formed on a surface of a substrate, to cause a silicon layer positioned below the intermediate layer to be exposed through the resist mask and the intermediate layer, a second process of subsequently supplying a chlorine gas to the substrate to cause a reaction product to attach onto sidewalls of opening portions of the resist mask and the intermediate layer, and a third process of etching a portion of the silicon layer corresponding to the opening portion of the intermediate layer using a process gas containing sulfur and fluorine to form a recess in the silicon layer.

Effect of the Invention

According to the present invention, when the recess is formed by etching a portion corresponding to the above opening portion by supplying a process gas containing sulfur and fluorine, the reaction product functions as a protection film for a sidewall of the intermediate layer thereby restricting side-etching of the intermediate layer.

MODE FOR CARRYING OUT THE INVENTION

Structure and Schematic Specification of Wafer

Figure 1:
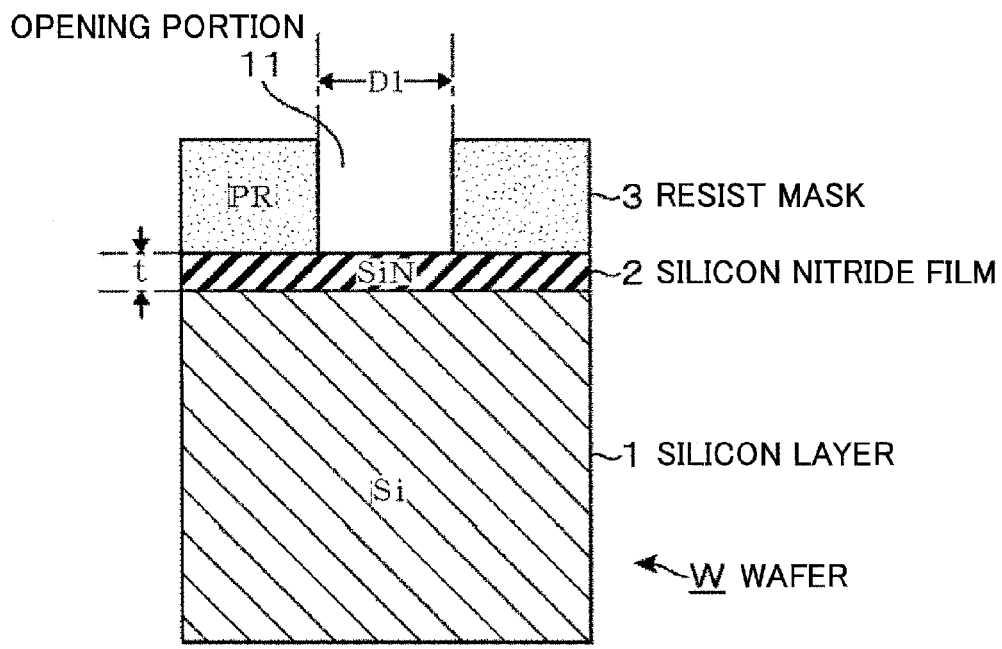
FIG. 1 is a longitudinal cross-sectional view of a substrate to which a plasma etching method of an embodiment of the present invention is applied.
Figure 2:
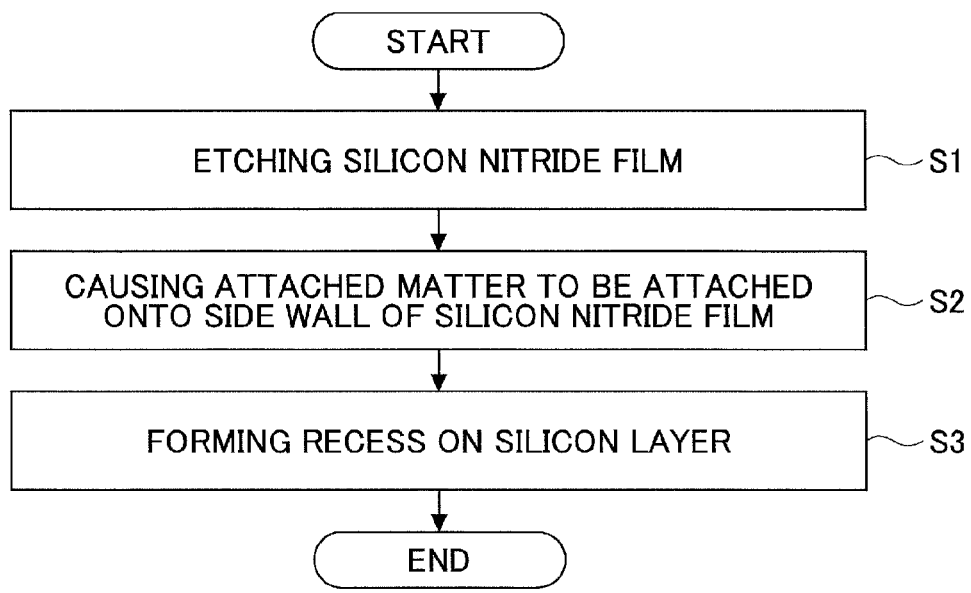
FIG. 2 is a flow chart of a sequential process of a plasma etching method of the embodiment of the present invention.

An exemplary mode of a plasma etching method of an embodiment of the present invention is described with reference to FIGS. 1 to 11. At first, described is an exemplary structure of a wafer W having a size of 12 inches, to which the plasma etching method is applied. Referring to FIG. 1, for example, this wafer W is formed by laminating a silicon nitride (SiN) film 2 containing silicon and nitrogen (N) on a monocrystalline silicon (Si) layer 1 and laminating a resist mask 3 on the silicon nitride (SiN) film 2 in this order from a lower side. The silicon nitride (SiN) film 2 is an exemplary intermediate layer having a thickness t of 100 μm. The resist mask 3 is made of a resin or the like. Cylindrical opening portions 11 having an opening size (a diameter) D1 of, for example, 11.2 μm are patterned to be formed at a plurality of positions on the resist mask 3. As described later, recesses 12 (see FIG. 4) such as a hole having a depth of, for example, 100 μm are formed by plasma of a process gas in the silicon nitride film 2 and the silicon layer 1, which are positioned on a lower layer side, at positions corresponding to the opening portions 11. Within the embodiment of the present invention, when the recess 12 is formed in the silicon layer 1, a protection film (attached matter 13) is formed on a sidewall of the silicon nitride film 2. The protection film prevents the silicon nitride film 2 from being side-etched from a side (a side of the recess 12) or restricts the silicon nitride film 2 from being side-etched. FIG. 1 is an enlarged view of an area around a single opening portion 11 on the wafer W.

Referring to FIGS. 2 to 11, a plasma etching method including a process of forming the above described attached matter 13 is explained. A known plasma apparatus can be used for performing plasma etching processes. An exemplary plasma apparatus is described later. As described in detail as follows, the plasma etching processes include a first process (step S1) of etching the silicon nitride film 2, a second process (step S2) of forming the protection film on the sidewall of the silicon nitride film 2 while slightly etching (about, for example, 1 μm) the silicon layer 1, and a third process (step S3) of forming the recess 12 having a depth of, for example, 100 μm by etching the silicon layer 1. In the process of forming the protection film, an area formed by etching the silicon layer 1 is also referred to as the "recess 12".

[Step S1: Etching Process of Silicon Nitride Film]

Figure 3:
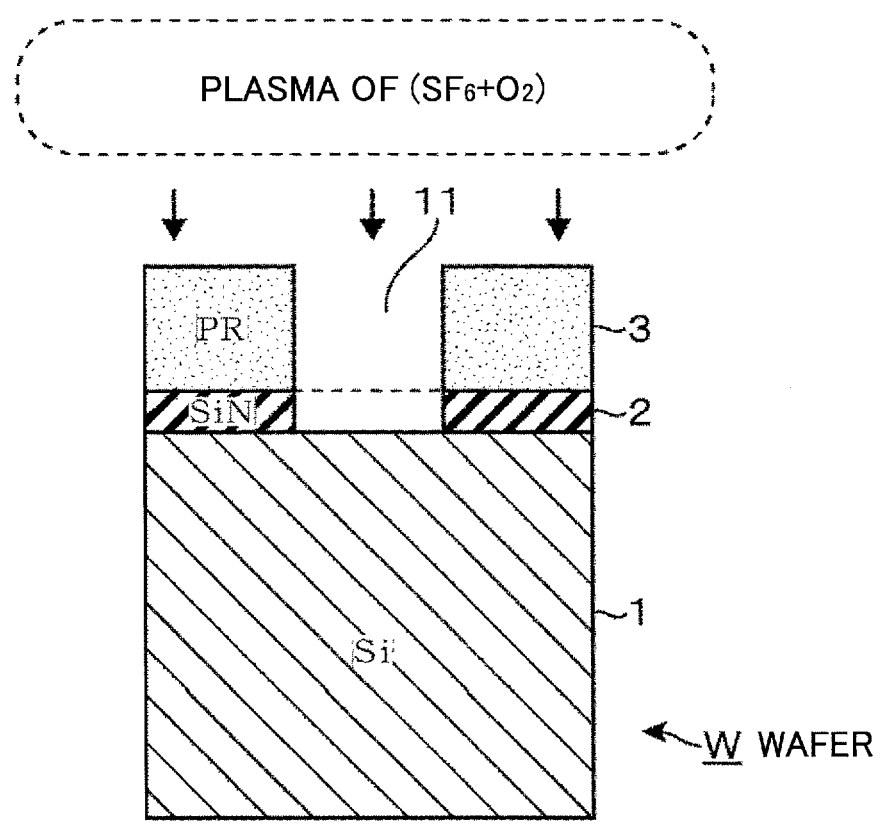
FIG. 3 is a longitudinal cross-sectional view of the substrate, in which the plasma etching method of the embodiment of the present invention functions.

At first, the silicon nitride film 2 undergoes the etching process. Specifically, a processing atmosphere (inside a treatment container 50) where the wafer W is placed is set to be a vacuum atmosphere. Simultaneously, plasma of a process gas containing a $SF_6$ (sulfur fluoride) gas and an $O_2$ (oxygen) gas is supplied to the wafer W. As illustrated in FIG. 3, the silicon nitride film 2 is etched through the resist mask 3 by the plasma. Then, the silicon layer 1 on the lower side of the silicon nitride film 2 is exposed through the silicon nitride film 2. Although the resist mask 3 is also etched, because the etching selectivity of the silicon nitride film 2 relative to the resist mask 3 is substantially great, the etching of the resist mask 3 is not illustrated. In FIGS. 4 to 10, the etching of the resist mask 3 is not illustrated.

[Step S2: Process of Forming Protection Film]

Figure 4:
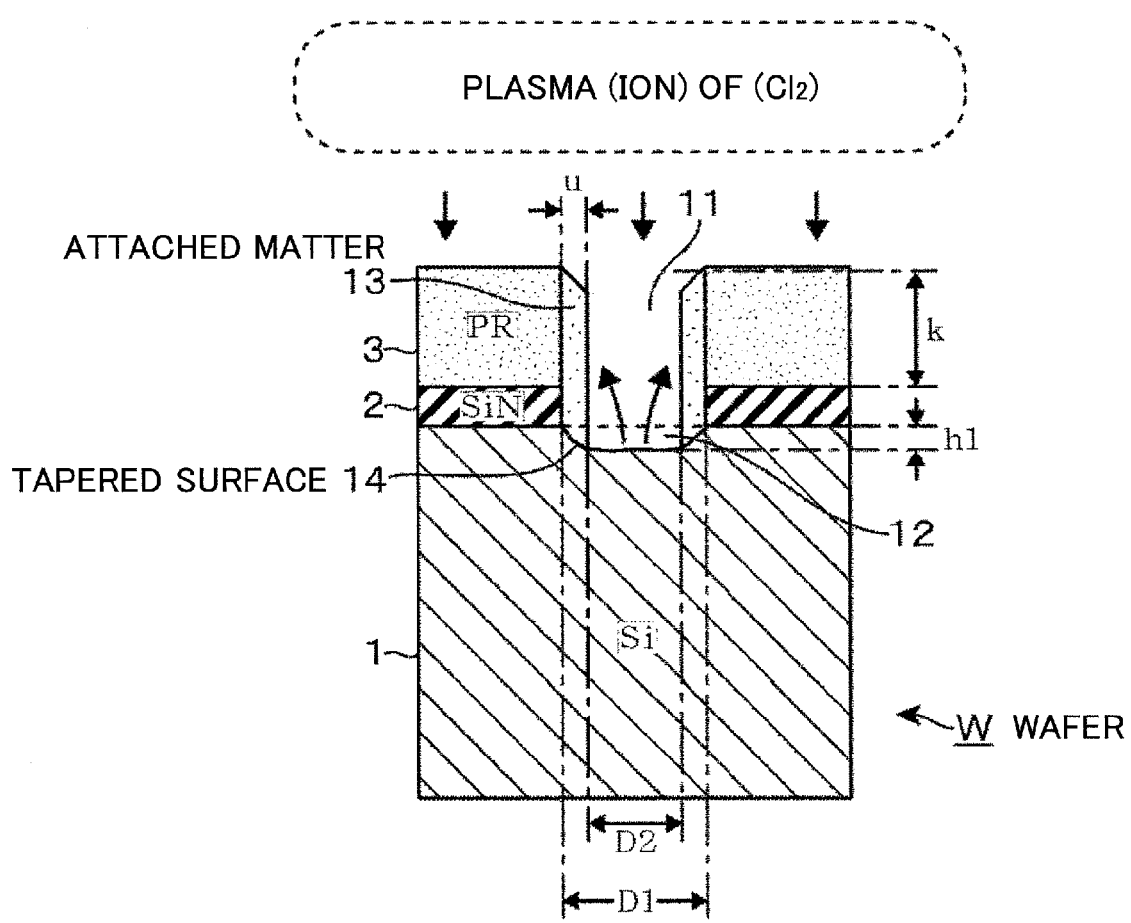
FIG. 4 is a longitudinal cross-sectional view of the substrate, in which the plasma etching method of the embodiment of the present invention functions.

Subsequently, a protection film may be formed on a sidewall of the silicon nitride film 2. Specifically, after evacuating the process gas, the degree of vacuum of a processing atmosphere is set to a range between 6.67 Pa (50 mTorr) to 13.33 Pa (100 mTorr), and a chlorine ($Cl_2$) gas as a process gas (an etching gas) is supplied to the above processing atmosphere at a flow rate of 200 sccm or greater. Within the embodiment, the degree of vacuum of the processing atmosphere is set to 6.67 Pa (50 mTorr), and a chlorine ($Cl_2$) gas as the process gas (the etching gas) is supplied to the above processing atmosphere at a flow rate of 400 sccm. Then, high-frequency power for generating plasma is applied to the process gas and simultaneously high-frequency power for biasing is applied to the wafer W. Then, the process gas is changed to plasma (ions) and is drawn toward the wafer W as illustrated in FIG. 4. In a case where a parallel plate plasma apparatus described below is used, high-frequency power for generating plasma is applied between parallel plate electrodes. Thus, the high-frequency power for biasing is applied to a lower electrode. When the chlorine ion contacts the silicon layer 1, the silicon layer 1 is very slightly etched so that the recess 12 is formed so as to correspond to the opening portion 11.

Figure 5:
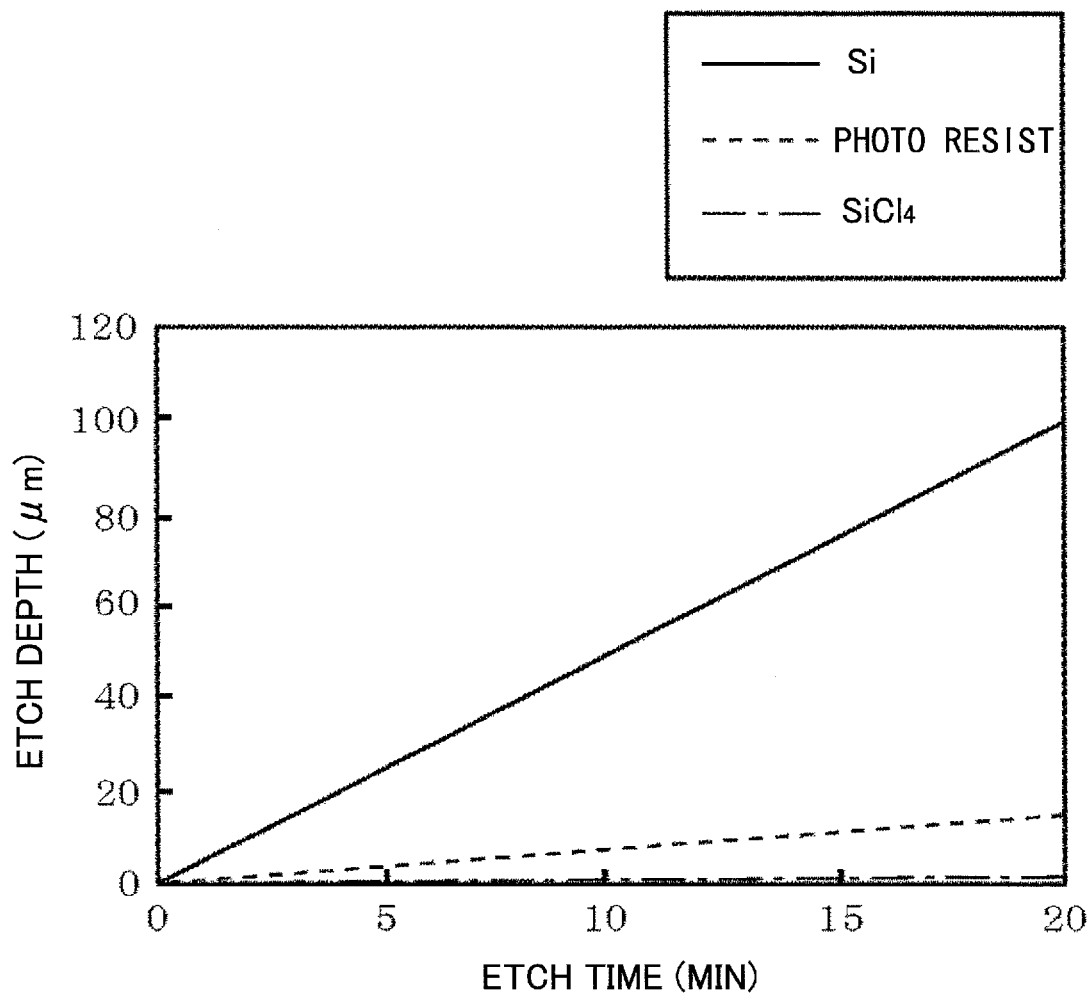
FIG. 5 is a graph illustrating a relationship between an etch time and an etch depth of layers of the embodiment of the present invention.
Figure 6:
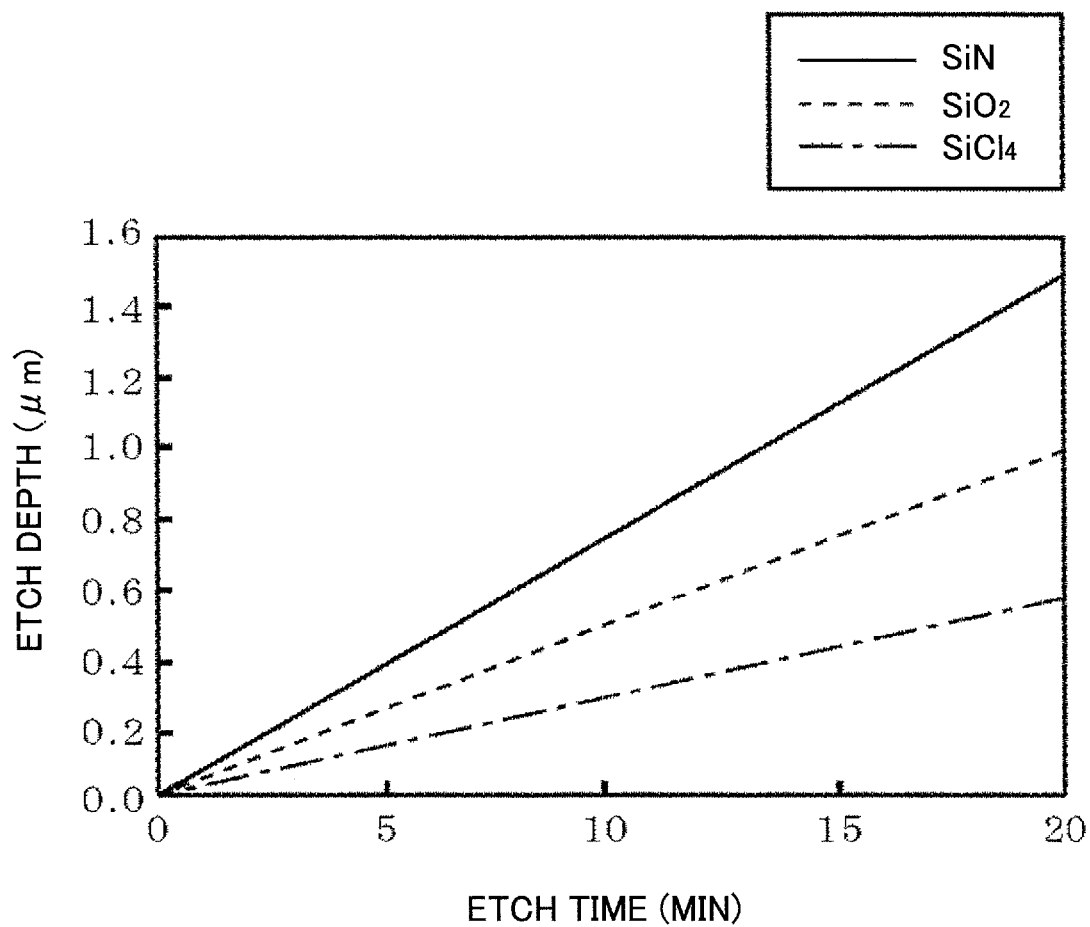
FIG. 6 is a graph illustrating a relationship between the etch time and the etch depth of layers of the embodiment of the present invention.

Here, when the silicon layer 1 is etched by the plasma of chlorine gas, silicon chloride ($SiCl_4$) being a reaction product containing silicon and chlorine is generated. The generated silicon chloride is attached to (is deposited on) the resist mask 3, the silicon nitride film 2, and the silicon layer 1 on the sidewall of the recess 12 as an attached matter 13. Referring to FIGS. 5 and 6, the attached matter 13 is difficult to be etched in comparison with the silicon layer 1 and the silicon nitride film 2. Therefore, the attached matter 13 functions as the protection film of the silicon nitride film 2 in an etching process of the silicon layer 1 performed subsequent to an attaching process of attaching the attached matter 13. Referring to FIGS. 5 and 6, the ordinate axis represents an etch depth (a film thickness) obtained by etching various films (an Si film, a photo resist film, an SiN film, an $SiO_2$ film, and an $SiCl_4$ film), and the abscissa axis represents an etch time spent for etching the films. FIG. 6 is an enlarged graph of FIG. 5 enlarged around a lower side (zero) of the ordinate axis.

Figure 7:
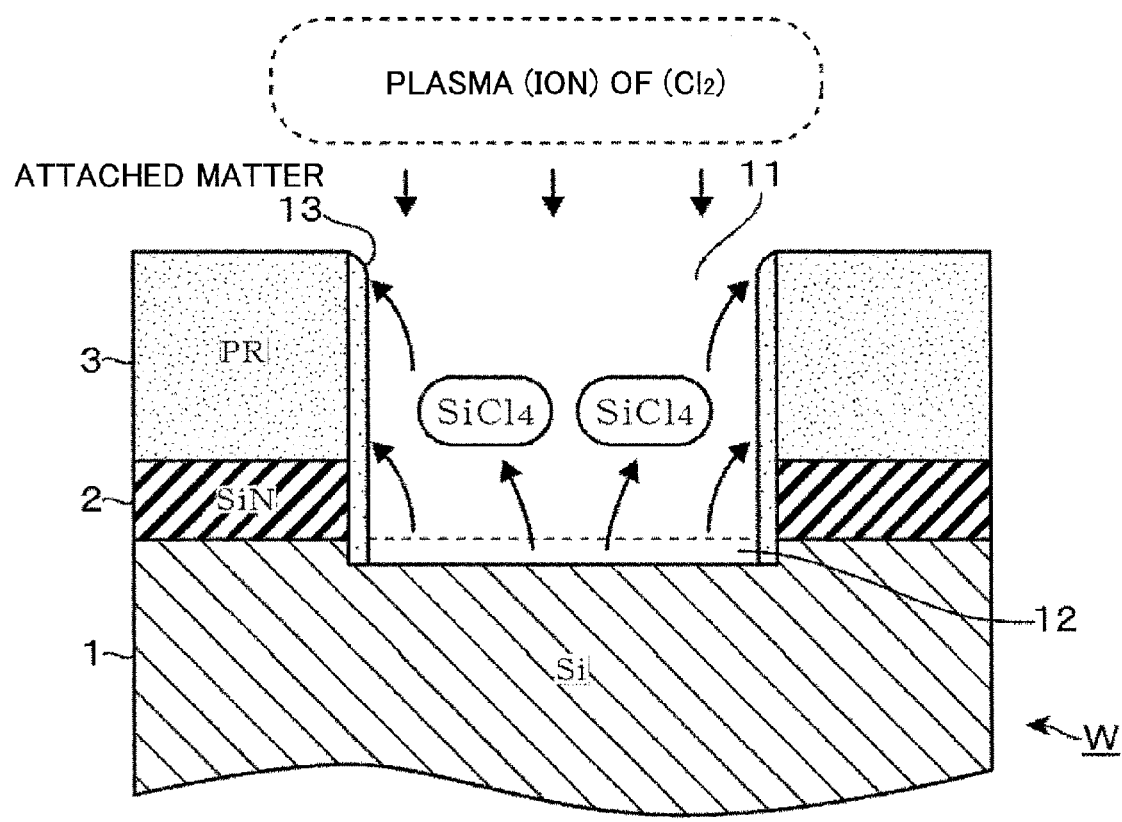
FIG. 7 is a longitudinal cross-sectional view of the substrate, in which the plasma etching method of the embodiment of the present invention functions.
Figure 8:
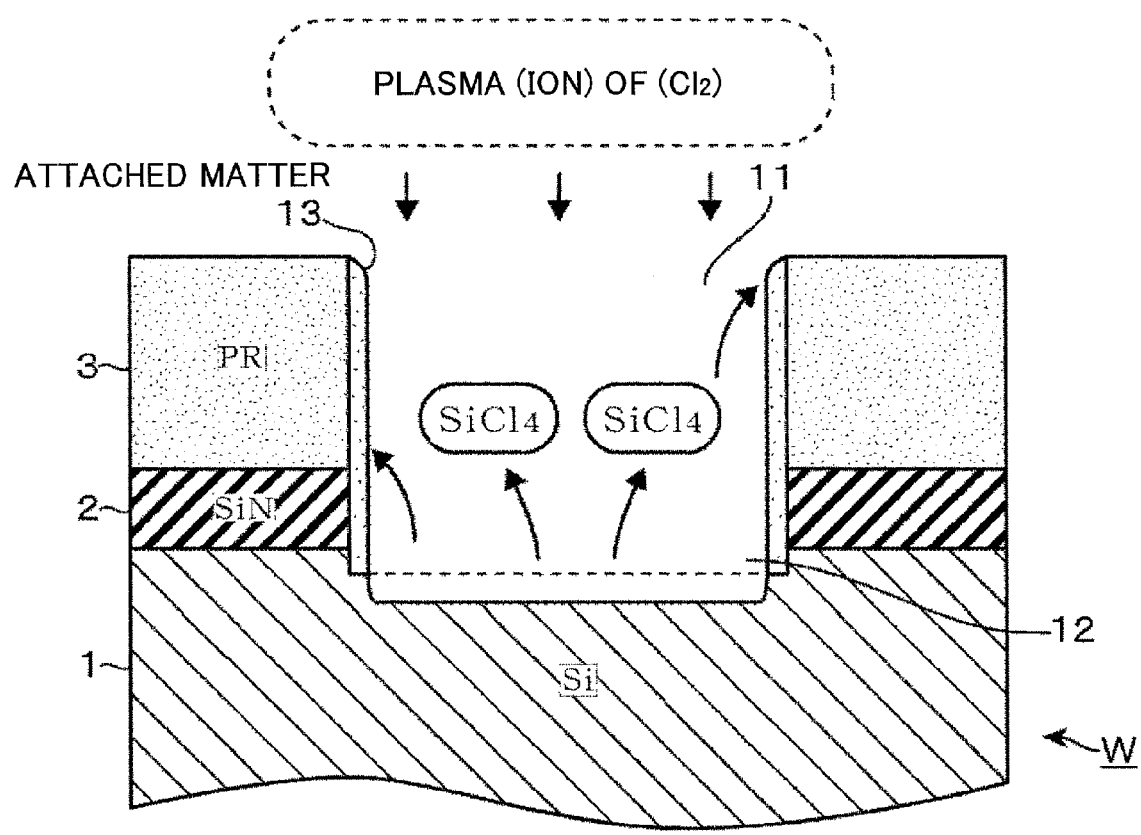
FIG. 8 is a longitudinal cross-sectional view of the substrate, in which the plasma etching method of the embodiment of the present invention functions.

At this time, as the attaching process of attaching the attached matter 13 proceeds, the opening size D1 of the recess 12 formed in the silicon layer 1 is gradually reduced. In the microscopic sense, after the silicon layer 1 has been very slightly etched, the recess 12 is formed to have substantially the same dimensions as the opening portion 11 of the resist mask 3 as illustrated in FIG. 7. If the attached matter 13 is attached onto the sidewall of the recess 12 by this etching, the attached matter 13 becomes a barrier to the chlorine ion (plasma) drawn on the side of the wafer W. Therefore, as illustrated in FIG. 8, the silicon layer 1 is etched by the chlorine ion using the attached matter 13 attached along the peripheral direction on the inner wall surface of the recess 12 of the silicon layer 1 as a mask. Referring to FIGS. 7 and 8, enlarged views of an area in the vicinity of the opening portion 11 of the resist mask 3 are schematically illustrated. The depth of the opening portion 11 is enlarged with exaggeration.

Subsequently, the attached matter 13 is attached onto the inner wall surface, which is newly a exposed on the recess 12. The silicon layer 1 is further etched using the attached matter 13. As described, as the attaching process of attaching the attached matter 13 proceeds, the opening size D1 of the recess 12 is gradually narrowed. Therefore, if a reference symbol "D2" (see FIG. 4) is attached to the opening size of the recess 12 on the lower end of the recess 12 formed by the attaching process of the attached matter 13, a tapered surface 14 is formed in the peripheral direction at the upper end position of the silicon layer 1. The diameter of the tapered surface 14 is gradually narrowed from the upper side to the lower side as illustrated in FIG. 4.

Until the width (thickness) u of the attached matter 13 becomes about, for example, 0.6 μm, the attaching process of attaching the attached matter 13 is continued for, for example, 2 minutes, and the attached matter 13 is attached onto and deposited on the inner peripheral surfaces of the opening portion 11 and of the recess 12 through the resist mask 3 to the tapered surface 14 of the silicon layer 1. At this time, the depth h1 of the silicon layer 1 etched by the plasma of the chlorine gas is, for example, 1 μm. The opening size D2 described above is, for example, 10 μm. Because the silicon layer 1 is highly anisotropically etched by the chlorine ions, side-etching from the side of the silicon layer 1 can be restricted.

The width u of the attached matter 13 is set from the following point of view. As illustrated in FIGS. 5 and 6, it is difficult to etch the attached matter 13 containing silicon and chlorine in comparison with the silicon nitride film 2 and the silicon layer 1. However, the attached matter 13 is slightly etched. Therefore, if the attached matter 13 attached onto the sidewall of the silicon nitride film 2 is removed (etched) in course of the etching process of the silicon layer 1 performed after the attaching process, a protection effect of the silicon nitride film 2 may not be preferably obtained. On the other hand, if the attached matter 13 remains on the sidewall of the silicon nitride film 2 after the etching process of the silicon layer 1 is completed, it may be difficult to embed a wiring metal inside the recess 12 in a subsequent process or the electric resistance of the wiring metal may be caused to increase. Therefore, within the embodiment of the present invention, the width u of the attached matter 13 is set or a process of removing the attached matter 13 is added so that the attached matter 13 on the sidewall of the silicon nitride film 2 is removed or is scarcely left by the above etching when the etching process of the silicon layer 1 is completed, namely the depth h2 of the recess 12 becomes about 100 μm as described above.

Specifically, as illustrated in FIGS. 5 and 6, the process gas (the etching gas) used for the etching process for the silicon layer 1 is used to etch the silicon layer 1 and the attached matter 13 ($SiCl_4$), and etch depths (film thicknesses) of the silicon layer 1 and the attached matter 13 per a unit time are previously measured. A time spent for etching the silicon layer 1 to obtain the recess 12 having a depth h2 (100 μm in this example) is 20 minutes in this example. Therefore, the attached matter 13 is preferably left for 20 minutes (is removed after 20 minutes) while the silicon layer 1 undergoes the etching process. Referring to FIG. 6, the film thickness of the attached matter 13 to be etched within 20 minutes is about 0.6 μm. Therefore, the width u of the attached matter 13 formed on the sidewall of the silicon nitride film 2 is 0.6 μm.

At this time, as described in an embodiment described below, the width u of the attached matter 13 varies from an upper end side to a lower end side of the silicon nitride film 2. Specifically, the width u of the attached matter 13 may be thicker on the upper end side than on the lower end side. Therefore, in a case where it is preferable to minimize side-etching of the silicon nitride film 2, the minimum value of the width u of the attached matter 13 attached to the sidewall of the silicon nitride film 2 is set to be 0.6 μm (described above) or 0.6 μm or greater between the upper end side and the lower end side of the silicon nitride film 2. On the other hand, in a case where the attached matter 13 remains as little as possible after completing the formation of the recess 12, the maximum value of the width u of the attached matter 13 between the upper end side and the lower end side of the silicon nitride film 2 is set to be 0.6 μm or 0.6 μm or smaller. At this time, instead of setting the width u of the attached matter 13 as described above, the process of removing the attached matter 13 may be performed. Alternatively, besides the width u is set as described above, the process of removing the attached matter 13 may be performed.

[Step S3: Etching Process of Silicon Layer 1]

Figure 9:
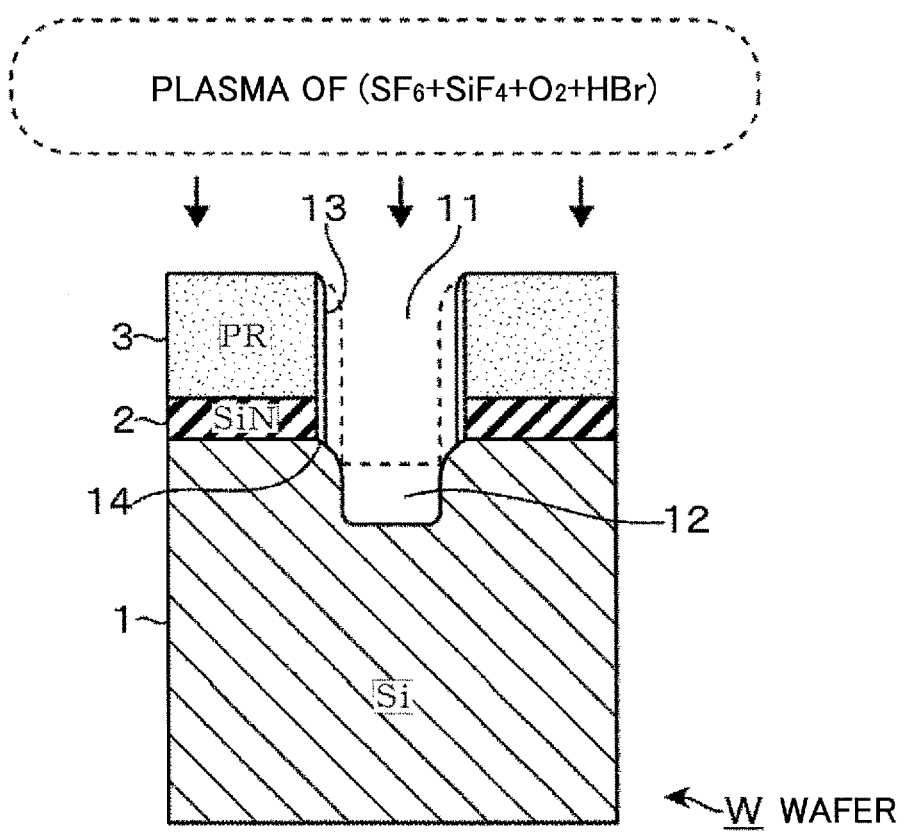
FIG. 9 is a longitudinal cross-sectional view of the substrate, in which the plasma etching method of the embodiment of the present invention functions.

Next, the etching process of the silicon layer 1 is described. At first, after removing the above described chlorine gas by evacuating the processing atmosphere where the wafer W is placed, plasma (radicals) of a processing gas containing a $SF_6$ gas, a $SiF_4$ (silicon fluoride) gas, an $O_2$ gas, and HBr (hydrogen bromide) gas is supplied under a processing atmosphere set to be the vacuum atmosphere, as illustrated in FIG. 9. By this plasma, the silicon layer 1 is etched toward a lower side of the silicon layer 1. Simultaneously, the attached matter 13 attached onto the resist mask 3, the silicon nitride film 2, and the sidewalls of the recess 12 are slightly etched from, for example, the side. At this time, as the attached matter 13 is etched from the side, the lower end side (an inner peripheral side) of the above described tapered surface 14 is exposed. Therefore, the lower end side of the tapered surface 14 is etched downward. Said differently, the taper angle of the tapered surface 14 becomes steep as the etching process of the silicon layer 1 proceeds. While the silicon layer 1 is etched, radicals (active species) containing fluorine derived from the $SF_6$ gas or radicals (active species) containing fluorine and sulfur especially contribute in the plasma.

Figure 10:
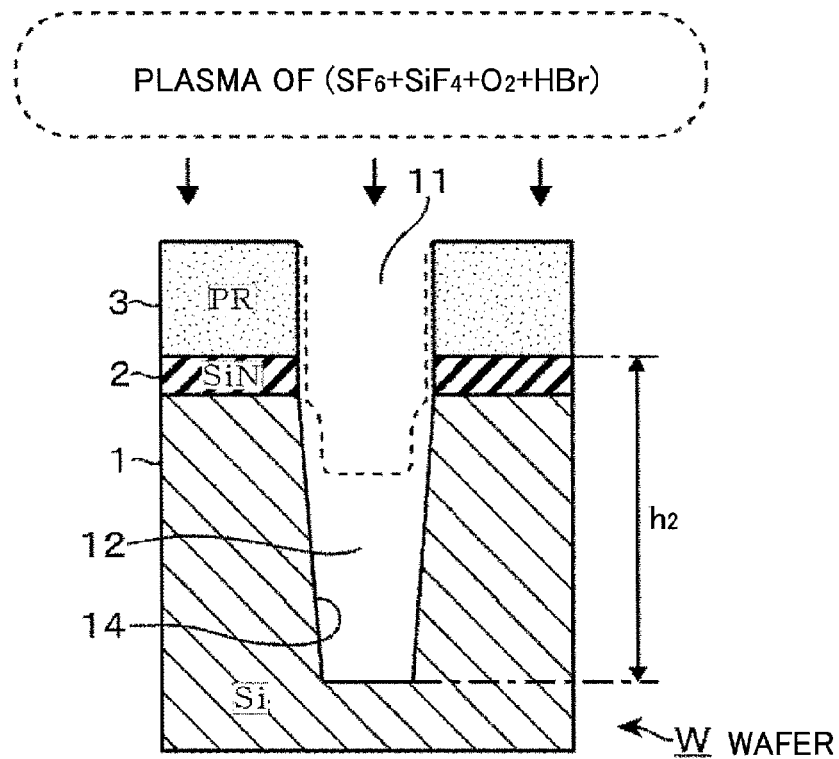
FIG. 10 is a longitudinal cross-sectional view of the substrate, in which the plasma etching method of the embodiment of the present invention functions.

Therefore, when the silicon layer 1 is etched until the depth h2 of the recess 12 becomes about, for example, 100 μm, the attached matter 13 attached to the resist mask 3, the silicon nitride film 2 and the upper end portion of the silicon layer 1 is removed or almost completely removed, as illustrated in FIG. 10. Then, as the silicon layer 1 is etched, the above described tapered surface 14 is gradually exposed to plasma from the lower end side (an inner peripheral side) to the upper end side (an outer peripheral side). Thus, the taper angle becomes further steep (approaching to the vertical) thereby forming the tapered surface 14 along the upward and downward directions of the recess 12. The opening size of the recess 12 at the lower end becomes a previously designed dimension, for example, 10 μm. Therefore, the opening size D1 of the opening portion 11 of the resist mask 3 is designed so as to be greater by the width u (0.6 μm×2) of the attached matter 13. In this example, the opening size D1 of the opening portion 11 of the resist mask 3 becomes 10 μm+0.6 μm×2=11.2 μm.

[Subsequent Process]

Figure 11:
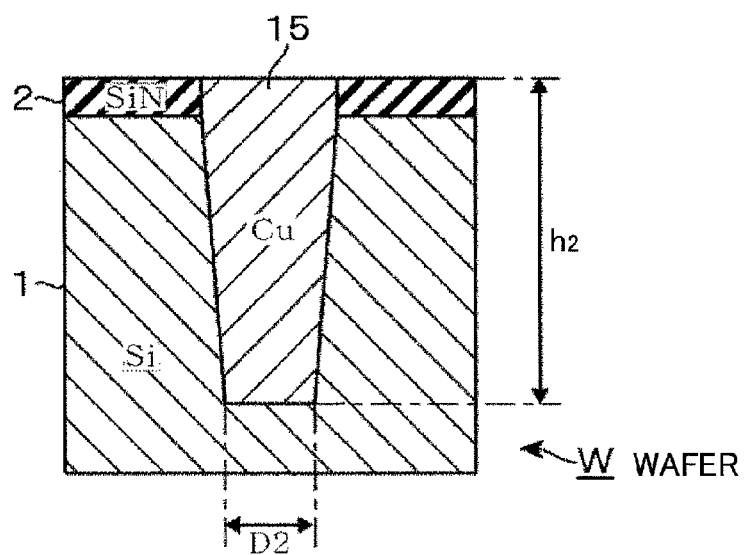
FIG. 11 is a longitudinal cross-sectional view of the substrate, in which the plasma etching method of the embodiment of the present invention functions.

After the silicon layer 1 is etched, the resist mask 3 undergoes ashing using, for example, plasma of a process gas containing an $O_2$ gas. Thereafter, the surface of the wafer W undergoes cleansing. Subsequently, the wiring metal 15 such as copper (Cu) is embedded into the inside of the recess 12 by a chemical vapor deposition (CVD) method, electrolytic plating, electroless plating, or the like. Thereafter, as illustrated in FIG. 11, an excess part of the wiring metal 15 formed on the surface of the wafer W is removed by a chemical mechanical polishing (CMP) process. At this time, the silicon nitride film 2 functions as a stopper film. Therefore, an end point of the CMP process is determined at the upper end position of the silicon nitride film 2.

[Etching Apparatus]

Figure 12:
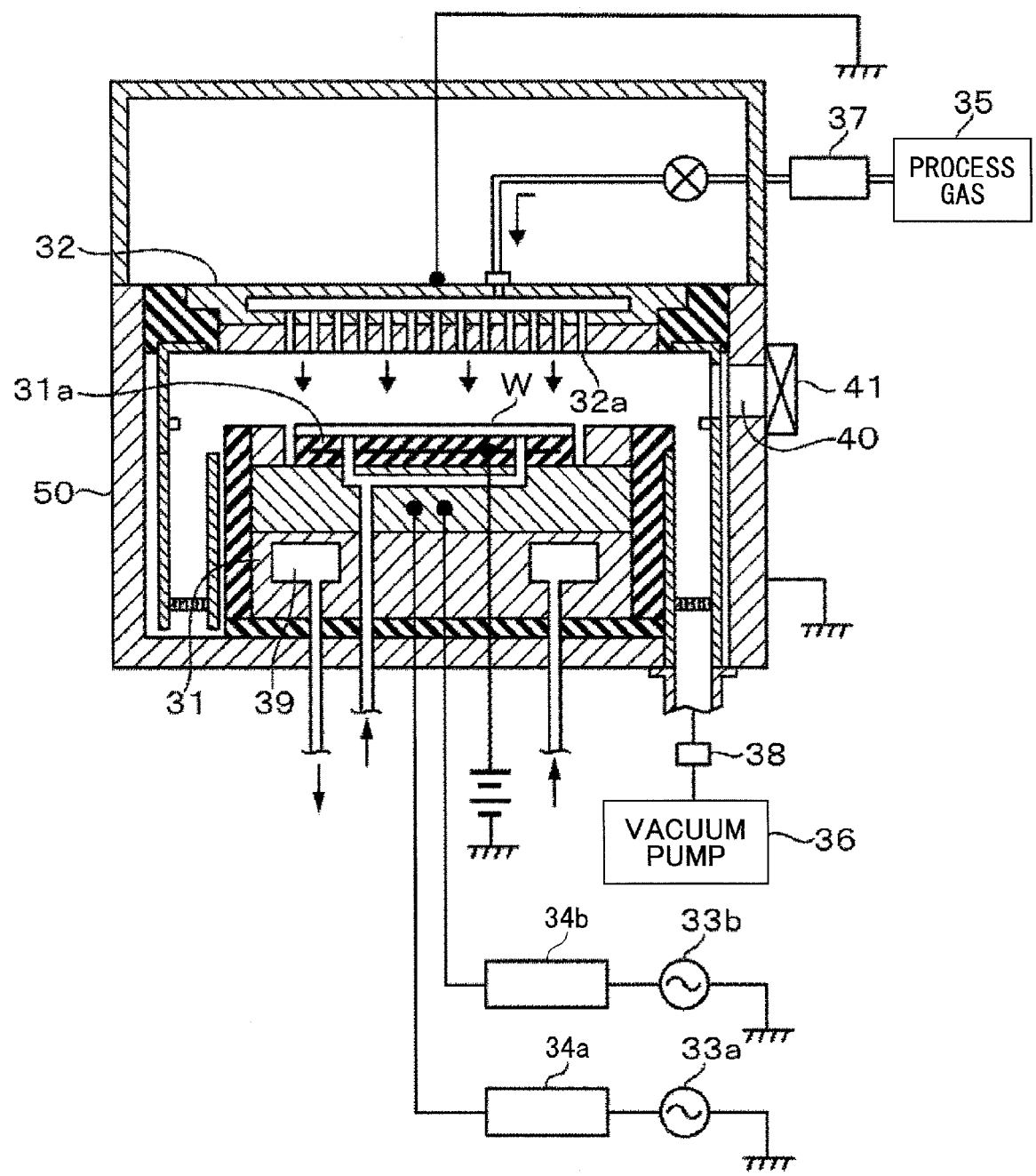
FIG. 12 is a longitudinal cross-sectional view of an exemplary plasma etching apparatus for performing the plasma etching method of the embodiment of the present invention.

Subsequently, referring to FIG. 12, an exemplary plasma etching apparatus for performing the above plasma etching method is briefly described. This plasma etching apparatus includes a mounting table 31 forming a lower electrode for mounting a wafer W and a gas shower head 32 provided on an upper side of the treatment container 50 so as to face the mounting table 31. This plasma etching apparatus is of a so-called dual-frequency lower electrode type. A high-frequency power source 33a for generating plasma and a high-frequency power source 33b for biasing are connected to the mounting table 31 through matching devices 34a and 34b, respectively. The high-frequency power source 33a outputs a high frequency of, for example, 40 MHz. The high-frequency power source 33b outputs high a frequency of, for example, 2 MHz.

A great number of gas supplying ports 32a are formed on a lower surface of the gas shower head 32. The process gas is output from a process gas supply source 35, and is supplied above the wafer W held by an electrostatic chuck 31a on the mounting table 31 through the gas supplying ports 32a. The vacuum pump 36 evacuates an ambient atmosphere inside the treatment container 50 from a side of floor surface of the treatment container 50. A flow rate adjusting portion 37 including a valve or the like is connected to the process gas supply source 35. A butterfly valve 38 is connected with the vacuum pump 36. A temperature controlling flow path 39 is provided in a mounting table 31. The wafer W is carried in or out from a transfer opening 40 for the wafer W by opening and closing the gate valve 41.

In a case where the above described plasma etching process is performed, the wafer W is mounted on the mounting table 31 through the transfer opening 40 by a collaboration function performed between a transfer arm outside the plasma etching apparatus and a lift pin (not illustrated) provided on a lower side of the mounting table 31. Subsequently, the inside of the treatment container 50 is evacuated to adjust the ambient atmosphere inside the treatment container 50 to be a process pressure. Simultaneously, the process gas is supplied inside the treatment container 50. Further, electric power of, for example, 1500 W is supplied from the high-frequency power source 33a for generating plasma and the high-frequency power source 33b for biasing to the mounting table 31 to change the process gas to plasma and simultaneously the plasma is drawn onto the side of the wafer W. Thus, the above described silicon nitride film 2 and the silicon layer 1 are etched.

According to the above embodiment, after the silicon nitride film 2 is etched to expose the silicon layer 1 to the outside, the silicon layer 1 is slightly etched using the plasma of the process gas containing chlorine. Thus, the attached matter 13 containing chlorine and silicon is attached onto the sidewall of the silicon nitride film 2. At this time, the attached matter 13 is hard to be etched in comparison with the silicon layer 1. The chlorine ion is plasma for anisotropic etching. Therefore, even in a case where the recess 12 formed in the silicon layer 1 has a depth of, for example, 100 µm, side-etching of the silicon nitride film 2, which is easily etched by fluorine radicals, can be restricted. Therefore, the width at the upper end position of the wiring metal 15, which is embedded in the recess 12, can be formed as designed. For example, short circuit between adjacent wiring metals 15, 15 can be prevented. Therefore, degradation of characteristic features such as increase of leak current can be suppressed.

Further, side-etching of the silicon nitride film 2 is suppressed. Therefore, undercut (broadening of the opening size D1 of the recess 12 from the upper side to the lower side) in the shape of the recess 12 can be prevented from occurring during the etching so that the opening size D2 on the lower side is narrower than the opening size D1 on the upper side. Thus, the wiring metal 15 can be easily embedded in the recess 12.

Further, the opening size D1 of the opening portion 11 of the resist mask 3 is greater than the opening size D2 of the recess 12 at the lower end position by the width u (specifically, the width u×2) of the attached matter 13 attached onto the sidewall of the recess 12. Therefore, the opening size D2 can be formed as designed.

Furthermore, the width u of the attached matter 13 is set so that the attached matter 13 is removed by etching after forming the recess 12 in the silicon layer 1 or so that the attached matter 13 scarcely remains after the etching. Therefore, an adverse influence to the wiring metal 15 such as choking of the recess 12 or an increase of the electric resistance in the wiring metal 15 can be suppressed.

Further, the attached matter 13 can be quickly formed by setting the processing conditions as described above in the process of attaching the attached matter 13 onto the sidewall of the silicon nitride film 2. Further, because the height k of the attached matter 13 becomes great as described in the following embodiment by setting the processing conditions as described above, it is possible to give high durability to the attached matter 13 against the plasma attracted to the wafer W from the upper side in the etching process of the silicon layer 1.

Here, the silicon nitride film 2 is exemplified as an intermediate layer laminated between the resist mask 3 and the silicon layer 1. However, instead of the silicon nitride film 2, a compound such as a SiCN film or the like to be etched by fluorine radicals inside the plasma used in etching the silicon layer 1 may be used. Further, the process gas containing chloride used for attaching the attached matter 13 to this film containing silicon (the silicon nitride film 2) may be the above described chlorine gas and a diluent gas such as an argon (Ar) gas, a helium (He) gas, an oxygen ($O_2$) gas, or the like. Further, although the recess 12 is formed to be a tapered shape, the recess 12 may be formed along a vertical direction. Further, a process of attaching the attached matter 13 onto the sidewall of the silicon nitride film 2 may be performed after setting the process pressure to be $3E^{-6}$ Pa to $7E^{-4}$ Pa ($3 \times 10^{-6}$ Pa to $7 \times 10^{-4}$ Pa) or setting the flow rate of the chlorine gas at 50 to 1000 sccm.

The above described etching apparatus may be an apparatus of a so-called single-frequency lower electrode type or a plasma etching apparatus of a so-called dual-frequency upper and lower electrode type.

Embodiment

Subsequently, described is an experiment of attaching the above described attached matter 13 onto the sidewall of the silicon nitride film 2 by actually using the apparatus illustrated in FIG. 12.

Experimental Example 1

Plasma etching to the wafer W having a size of 300 mm (12 inches), in which the silicon nitride film 2 is etched as illustrated in FIG. 3, is performed under each variously changed process pressure using the chlorine gas. The processing conditions other than the process pressure are common to the examples. The flow rate of the chlorine gas is set to be 100 sccm.

(Process Pressure)

Example: 6.67 Pa (50 mTorr), 13.3 Pa (100 mTorr)
Comparative Example: 2.67 Pa (20 mTorr)

Figure 13:
FIG. 13 illustrates the longitudinal cross-sectional views of the substrates obtained in the embodiment of the present invention.
Figure 13:
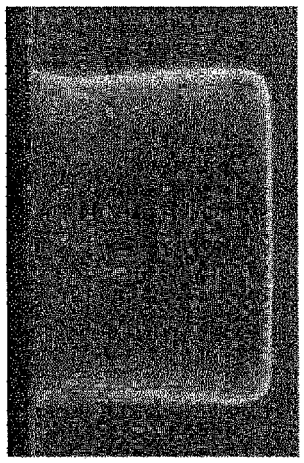
Figure 13:
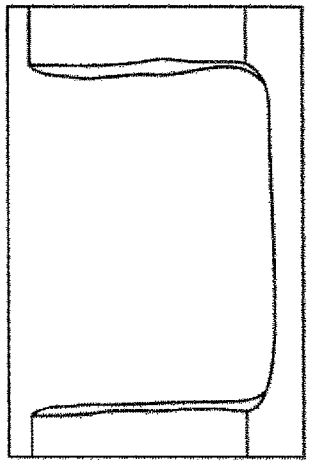
Figure 13:
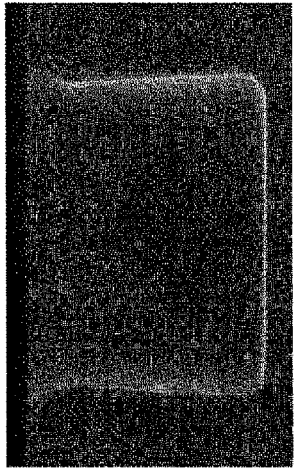
Figure 13:
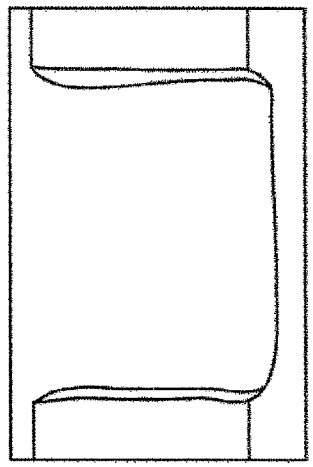
Figure 13:
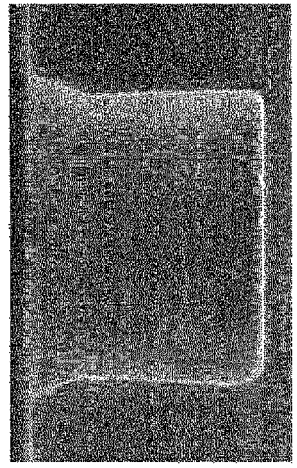
Figure 13:
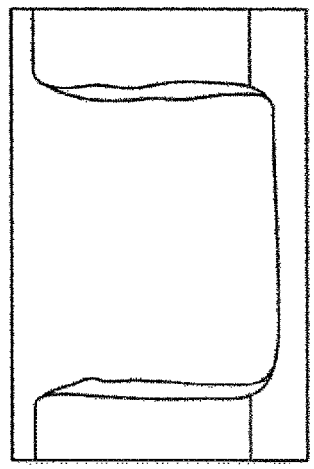

As a result, as illustrated in FIG. 13, as the process pressure increases (the degree of vacuum decreases), the height k of the attached matter 13 increases. Under the process pressure of 6.67 Pa (50 mTorr) or greater, the upper end portion of the attached matter 13 reaches a vicinity of the surface of the resist mask 3. Therefore, the process pressure is preferably 6.67 Pa (50 mTorr) or greater in order to obtain preferable etching durability of the attached matter 13 at the time of etching the silicon layer 1 as described above. On the lower side of FIG. 13, drawings obtained by reading scanning electron microscope (SEM) photos illustrated on the upper side are illustrated. In the drawings, boarders between the attached matter 13 and the silicon nitride film 2 are depicted.

Experimental Example 2

Figure 14:
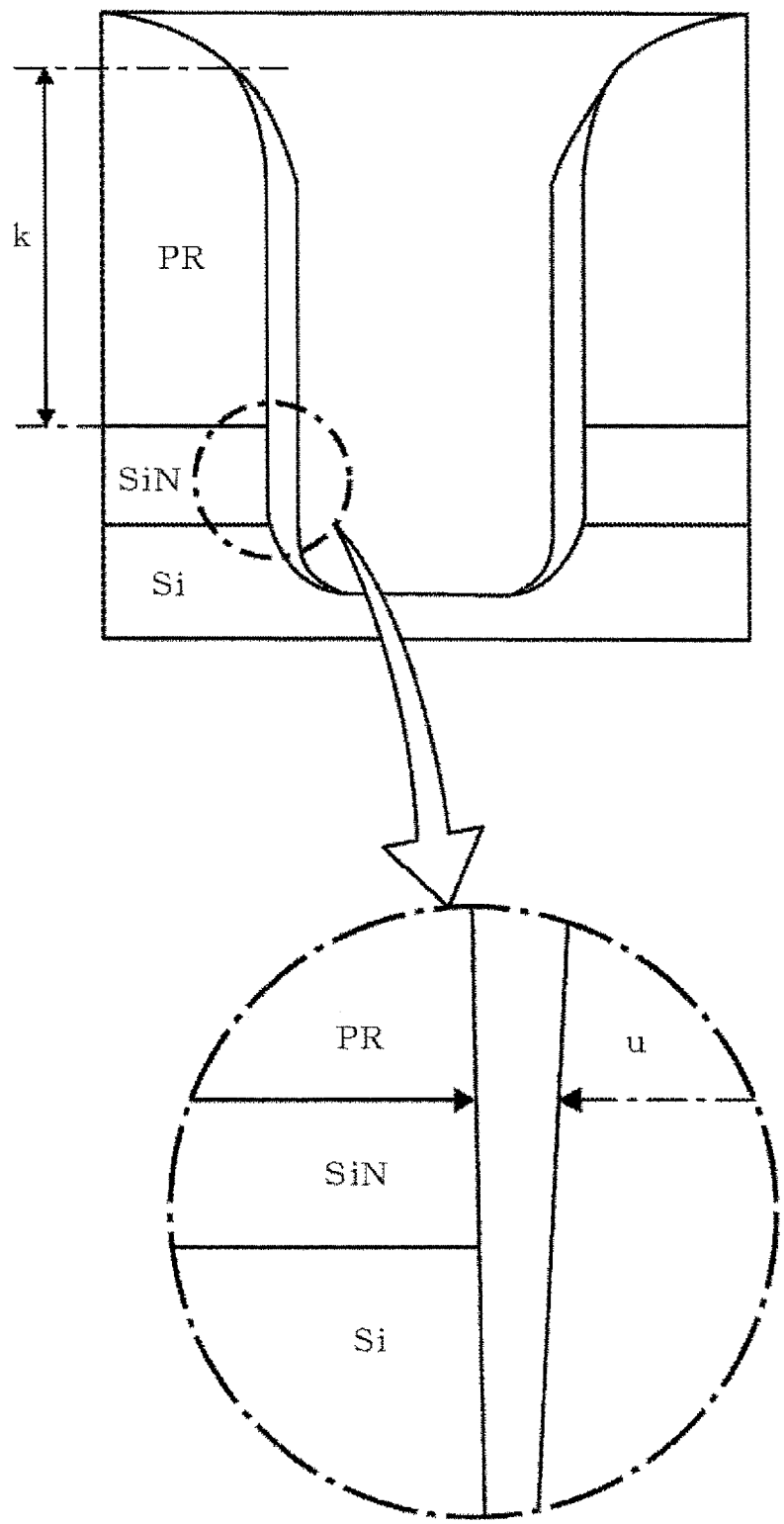
FIG. 14 schematically illustrates dimensions of attached matter obtained in the embodiment of the present invention.

Subsequently, the experiments are performed while the flow rates of the chlorine gases are variously changed in the process of generating the attached matter 13 as illustrated in the following table. Then, the widths u of the attached matter 13 and the heights k of the attached matter 13 are measured in a center portion (center) of the wafer W and an edge portion (edge) of the wafer W. In the experiment, while the process pressures are set to be 6.67 Pa (50 mTorr), the etching processes are performed for 2 minutes. Referring to FIG. 14, the widths u of the attached matter 13 are obtained by measuring at the upper end position of the silicon nitride film 2, and the heights k of the attached matter 13 are obtained by measuring between the upper end position of the attached matter 13 and the upper end position of the silicon nitride film 2.

TABLE 1

| | GAS FLOW RATE (sccm) | | | | | |
|---|---|---|---|---|---|---|
| | 600 | | 800 | | 1000 | |
| MEASURED POSITION | CENTER PORTION | EDGE PORTION | CENTER PORTION | EDGE PORTION | CENTER PORTION | EDGE PORTION |
| OPENING SIZE ($\mu$m) | 10.91 | 11.23 | 10.87 | 11.11 | 10.72 | 10.56 |
| HEIGHT OF DEPOSIT ($\mu$m) | 6.25 | 5.56 | 5.99 | 6.05 | 6.07 | 6.39 |
| WIDTH OF DEPOSIT ($\mu$m) | 0.54 | 0.60 | 0.60 | 0.62 | 0.62 | 0.64 |

Figure 15:
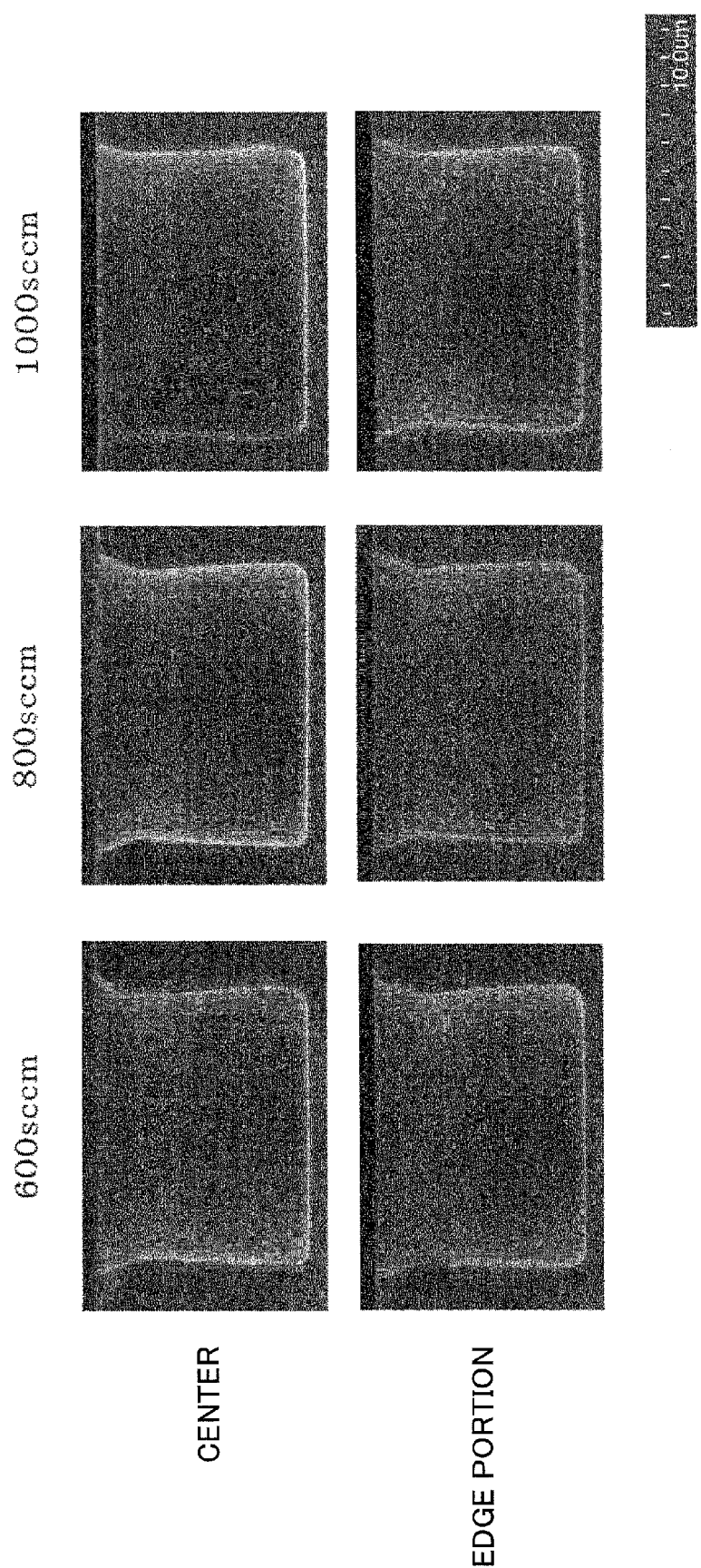
FIG. 15 illustrates the longitudinal cross-sectional views of the substrates obtained in the embodiment of the present invention.

As a result, as illustrated in the above table and FIG. 15, the attached matter 13 is preferably obtained under any conditions. It is known that the width u of the attached matter 13 is thickened as the flow rate of the process gas is increased. Therefore, in order to quickly obtain the attached matter 13, the gas flow rate is preferably, for example, 800 sccm or greater. Although the experimental result or the like is omitted, if the process gas is 200 sccm or greater, the attached matter 13 is obtainable.

Experimental Example 3

Figure 16:
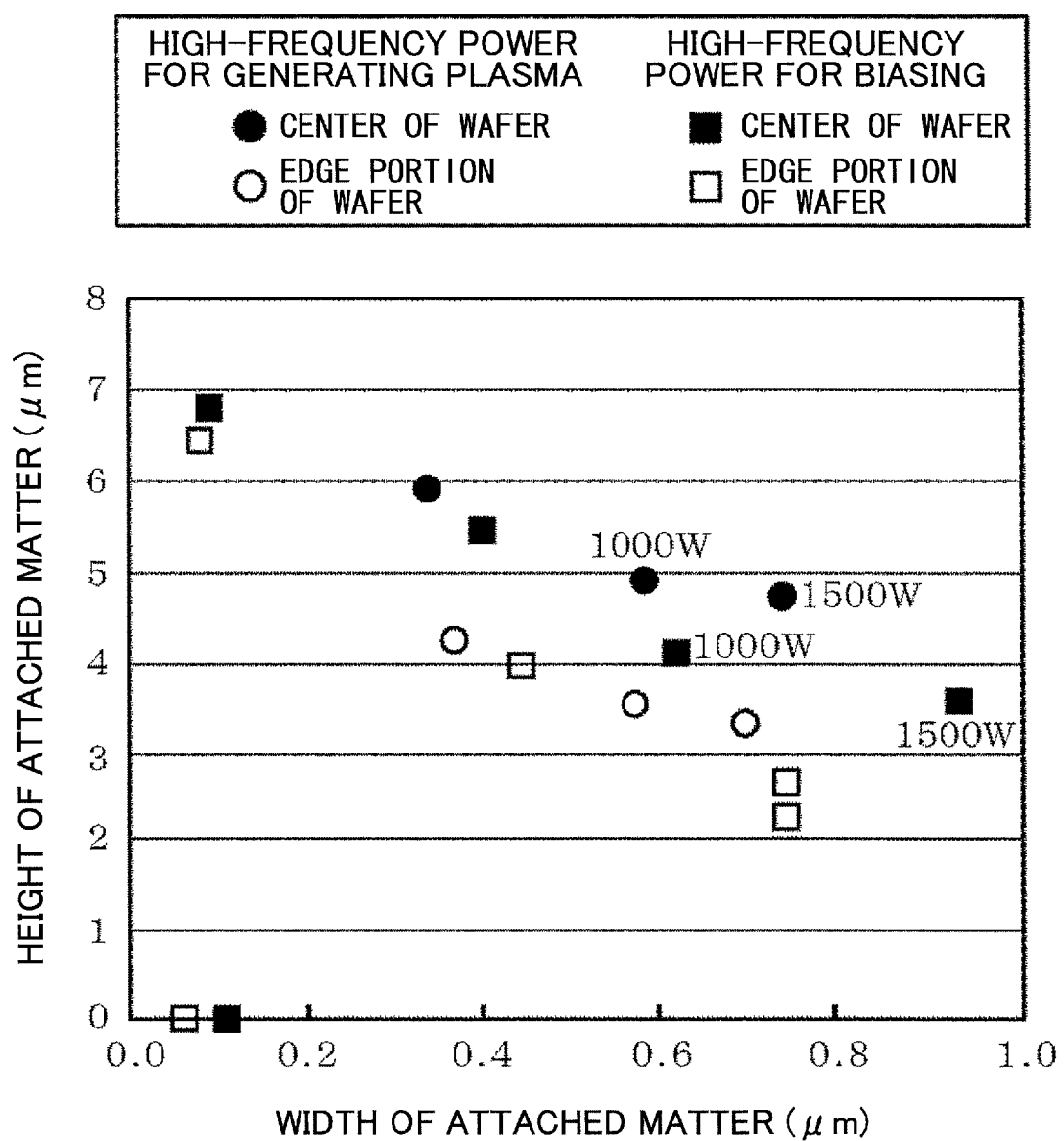
FIG. 16 illustrates characteristic features obtained in the embodiment of the present invention.

Further, the widths u and the heights k of the attached matter 13 are measured on the side of the center portion and the side of the edge portion, respectively. As a result, it is known that the good attached matter 13 (having the width u of 0.6 $\mu$m or greater) can be obtained by setting the high frequency power supplied from the high frequency power sources 33a and 33b to 1000 W or greater, as illustrated in FIG. 16. Further, in a case where the high-frequency power of the high-frequency power source 33a and 33b is 1000 W or greater, the dimensions of the attached matter 13 are substantially in the same level. In the experiment, the electric energy of one of the high-frequency power sources 33a and 33b is set to 1000 W or 1500 W, and the electric energy of the other one of the high-frequency power sources 33a and 33b is set to 50 W.

(Overview)

As described above, the plasma etching method of the embodiment of the present invention includes a first process of etching an intermediate layer, which contains silicon and nitrogen and is positioned below a resist mask formed on a surface of a substrate, to cause a silicon layer positioned below the intermediate layer to expose on the resist mask and the intermediate layer, a second process of subsequently supplying a chlorine gas to the substrate to cause a reaction product to attach onto sidewalls of opening portions of the resist mask and the intermediate layer, and a third process of etching a portion of the silicon layer corresponding to the opening portion of the intermediate layer using a process gas containing sulfur and fluorine to form a recess in the silicon layer.

The second process may be performed under a pressure ambient atmosphere of $3E^{-6}$ Pa to $7E^{-4}$ Pa ($3\times10^{-6}$ Pa to $7\times10^{-4}$ Pa). Further, the substrate is a 12-inch wafer, and the chlorine gas is supplied from a gas shower head whose surface facing the substrate having a great number of gas supplying ports in the second process and simultaneously a flow rate of the chlorine gas may be set to 50 sccm to 1000 sccm. Further, the second process may be a process of attaching the reaction product by adjusting a film thickness of the reaction product so that the reaction product is removed by the process gas containing a chemical compound of sulfur and fluorine when the recess is formed in the silicon layer in the third process.

According to these, after the intermediate layer which is positioned below the resist mask and contains silicon and nitrogen is etched and the silicon layer positioned below the intermediate layer is exposed, the chlorine gas is supplied to the substrate so that the reaction product is attached to the sidewall of the opening portion of the intermediate layer. Therefore, when the recess is formed by etching the portion corresponding to the above opening portion by supplying the process gas containing sulfur and fluorine, the reaction product functions as the protection film for the sidewall of the intermediate layer thereby restricting side-etching of the intermediate layer.

Although preferred embodiments of the present invention have been described with reference to the accompanied drawings, the present invention is not limited to the examples. It is clear that one skilled in the art can conceive various alternative constructions or modifications within technical idea recited in the scope of claims. These alternative constructions or modifications naturally fall within the technical scopes of the present invention.

This international application is based on and claims priority to Japanese Patent Application No. 2011-025083 filed on Feb. 8, 2011, the entire contents of Japanese Priority Patent Application No. 2011-025083 are hereby incorporated herein by reference.

EXPLANATION OF REFERENCE SIGNS

W: wafer;
1: silicon layer;
2: silicon nitride film;
3: resist mask;
11: opening portion;
12: recess;
13: attached matter;
14: tapered surface; and
15: wiring metal.

The invention claimed is:

1. A plasma etching method comprising:
a first process of etching an intermediate layer, which contains silicon and nitrogen and is positioned below a resist mask formed on a surface of a substrate, to cause a silicon layer positioned below the intermediate layer to be exposed through the resist mask and the intermediate layer;
a second process of subsequently supplying a chlorine gas to the substrate to cause a reaction product to attach onto sidewalls of opening portions of the resist mask and the intermediate layer, wherein the reaction product is silicon chloride and
a third process of etching a portion of the silicon layer corresponding to the opening portion of the intermediate layer using a process gas containing sulfur and fluorine to form a recess in the silicon layer.

2. The plasma etching method according to claim 1, wherein the second process is performed under a pressure ambient atmosphere of $3\times10^{-6}$ Pa to $7\times10^{-4}$ Pa.

3. The plasma etching method according to claim 1, wherein the substrate is a 12-inch wafer, and
wherein the chlorine gas is supplied from a gas shower head whose surface facing the substrate having a great number of gas supplying ports in the second process, and simultaneously a flow rate of the chlorine gas is set to 50 sccm to 1000 sccm.

4. The plasma etching method according to claim 1, wherein the second process may be a process of attaching the reaction product by adjusting a film thickness of the reaction product so that the reaction product is removed by the process gas containing a chemical compound of sulfur and fluorine when the recess is formed in the silicon layer in the third process.

* * * * *